US012566243B2

(12) United States Patent
Ahmad et al.

(10) Patent No.: US 12,566,243 B2
(45) Date of Patent: Mar. 3, 2026

(54) TRANSCEIVER CIRCUIT AND ASSOCIATED CROSS-COUPLING INTERFERENCE MITIGATION METHOD

(71) Applicant: TEXAS INSTRUMENTS INCORPORATED, Dallas, TX (US)

(72) Inventors: Zeshan Ahmad, Plano, TX (US); Mayank Kumar Singh, Mountain View, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 425 days.

(21) Appl. No.: 18/157,511

(22) Filed: Jan. 20, 2023

(65) Prior Publication Data
US 2024/0248169 A1 Jul. 25, 2024

(51) Int. Cl.
*G01S 7/00* (2006.01)
*G01S 7/03* (2006.01)
(Continued)

(52) U.S. Cl.
CPC .............. *G01S 7/038* (2013.01); *G01S 7/354* (2013.01); *H03F 3/245* (2013.01); *G01S 13/931* (2013.01);
(Continued)

(58) Field of Classification Search
CPC ........ G01S 7/038; G01S 7/354; G01S 13/931; G01S 7/352; G01S 13/343; H03F 3/245;
(Continued)

(56) References Cited

U.S. PATENT DOCUMENTS

| | | | | |
|---|---|---|---|---|
| 10,326,420 | B1 * | 6/2019 | Bellaouar | .............. H03F 1/086 |
| 11,750,253 | B2 * | 9/2023 | Wang | ................... H04B 7/0602 |
| | | | | 455/101 |
| 2019/0250264 | A1 * | 8/2019 | Belfiore | ................ G01S 7/285 |
| 2021/0258040 | A1 * | 8/2021 | Musayev | ............... H03F 3/189 |

(Continued)

FOREIGN PATENT DOCUMENTS

WO WO 2020041875 A1 3/2020
WO WO 2021232030 A1 11/2021

OTHER PUBLICATIONS

ECEN620: Network Theory Broadband Circuit Design, Fall 2021, "Lecture 13: Transimpedance Amplifiers (TIAs)", Sam Palermo Analog & Mixed-Signal Center, Texas A&M University, 63 pgs.
(Continued)

*Primary Examiner* — Md K Talukder
(74) *Attorney, Agent, or Firm* — Michael T. Gabrik; Frank D. Cimino

(57) ABSTRACT
In an embodiment, a system includes: an analog-to-digital converter (ADC); a transmitter path; a receiver path including a first amplifier including: an output coupled to the ADC, and a first high-pass filter; and a controller coupled to the transmitter path and to the receiver path, where the controller is configured to: cause a corner frequency of the first high-pass filter to increase from a first value to a second value, simultaneously or after causing the corner frequency of the first high-pass filter to increase, cause the transmitter path to be enabled, and after a first signal begins transmission in the enabled transmitter path, and during transmission of the first signal in the enabled transmitter path, cause the corner frequency of the first high-pass filter to decrease from the second value to the first value.

24 Claims, 10 Drawing Sheets

(51) Int. Cl.
  *G01S 7/35* (2006.01)
  *H03F 3/24* (2006.01)
  *G01S 13/931* (2020.01)
(52) U.S. Cl.
  CPC ................. *H03F 2200/165* (2013.01); *H03F 2200/171* (2013.01); *H03F 2200/294* (2013.01); *H03F 2200/451* (2013.01)
(58) Field of Classification Search
  CPC ......... H03F 2200/165; H03F 2200/171; H03F 2200/294; H03F 2200/451; H03F 3/195; H03F 3/72; H03F 3/45475
  See application file for complete search history.

(56) References Cited

U.S. PATENT DOCUMENTS

| | | | |
|---|---|---|---|
| 2022/0137181 A1 | 5/2022 | Santra et al. | |
| 2022/0260700 A1* | 8/2022 | Mohta ..................... | G01S 13/34 |
| 2023/0128469 A1* | 4/2023 | Garrity ................ | G01S 13/347 |
| | | | 342/129 |
| 2024/0154585 A1 | 5/2024 | Roeckner | |
| 2024/0248169 A1* | 7/2024 | Ahmad ................... | H03F 3/245 |

OTHER PUBLICATIONS

Sahu, et al., "A 45nm 76-81GHz CMOS Radar Receiver for Automotive Applications", IEEE Asian Solid-State Circuits Conference, Nov. 4-6, 2019, The Parisian Macao, Macao SAR, China. 4 pgs.
PCT/US2024/012156_International_Search_Report, 3 pages.

* cited by examiner

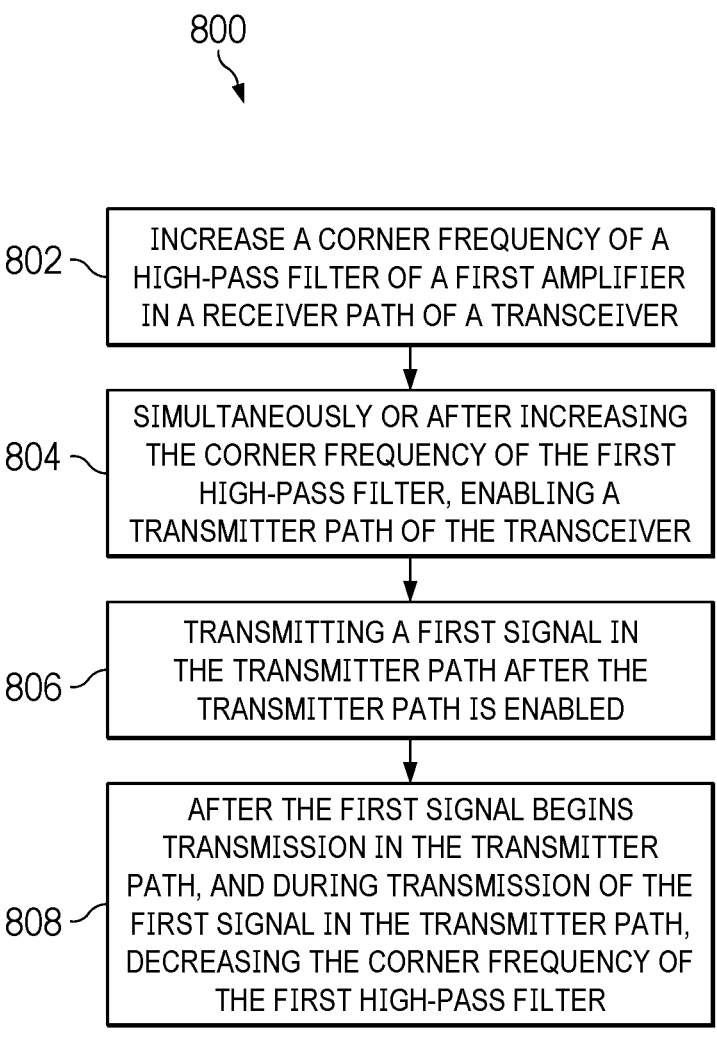

800

802 — INCREASE A CORNER FREQUENCY OF A HIGH-PASS FILTER OF A FIRST AMPLIFIER IN A RECEIVER PATH OF A TRANSCEIVER

804 — SIMULTANEOUSLY OR AFTER INCREASING THE CORNER FREQUENCY OF THE FIRST HIGH-PASS FILTER, ENABLING A TRANSMITTER PATH OF THE TRANSCEIVER

806 — TRANSMITTING A FIRST SIGNAL IN THE TRANSMITTER PATH AFTER THE TRANSMITTER PATH IS ENABLED

808 — AFTER THE FIRST SIGNAL BEGINS TRANSMISSION IN THE TRANSMITTER PATH, AND DURING TRANSMISSION OF THE FIRST SIGNAL IN THE TRANSMITTER PATH, DECREASING THE CORNER FREQUENCY OF THE FIRST HIGH-PASS FILTER

FIG. 8

TRANSCEIVER CIRCUIT AND ASSOCIATED CROSS-COUPLING INTERFERENCE MITIGATION METHOD

CROSS-REFERENCE TO RELATED APPLICATIONS

This application is related to co-pending U.S. patent application Ser. No. 18/157,556, filed on the same day as this application, entitled "Transceiver Circuit and Associated Interference Mitigation Method," which application is hereby incorporated herein by reference.

TECHNICAL FIELD

The present disclosure relates generally to an electronic system and method, and, in particular embodiments, to a transceiver circuit and associated cross-coupling interference mitigation method.

BACKGROUND

FIG. 1 shows a schematic diagram of exemplary millimeter-wave radar system 100. During normal operation, frequency-modulated continuous wave (FMCW) synthesizer 114 generates transmitter signal $S_{TX}$, which includes chirps to be transmitted by power amplifier (PA) 108 via transmitting antenna 104. The chirps transmitted by transmitting antenna 104 are reflected by objects (e.g., 101) in the field-of-view of radar system 100, and are received by receiving antenna 102. The reflected chirps received by receiving antenna are amplified by low-noise amplifier (LNA) 106 to generate receiver signal $S_{RX}$. The transmitter signal $S_{TX}$ and receiver signal $S_{RX}$ are mixed by mixer 110 to generate intermediate frequency signal $S_{IF}$. Intermediate frequency signal $S_{IF}$ is amplified by amplifier 112 to generate output voltage $V_{out}$. Output voltage $V_{out}$ is digitized using analog-to-digital converter (ADC) 116 to generate raw radar digital data $D_{raw}$. Data $D_{raw}$ is then processed by radar processing system 118, e.g., to detect and track targets, classify targets, etc.

Generally, the time between chirps (also referred to as pulse repetition time) dictates the ability of the system to unambiguously detect the maximum velocity of a target (shorter pulse repetition times result in a higher maximum velocity of the target for the target to be detected unambiguously following the relationship, $$\vartheta_{max} = \frac{c}{4\ f_0\ T_c},$$

where c is velocity of light, $f_0$ is carrier frequency of the system, and $T_c$ is the pulse repetition time). Therefore, for a given carrier frequency, shorter $T_c$ are generally highly desirable to meet the practical needs of sensors used in various automotive domains as part of the Advanced Driver Assist System (ADAS)—a precursor to self-driving cars and example applications include such as automatic emergency breaking (AEB), cruise control, cross-traffic alert (CTA), back-side detection (BSD) to avoid collisions and many more.

SUMMARY

In accordance with an embodiment, a system includes: an analog-to-digital converter (ADC); a transmitter path; a receiver path including a first amplifier including: an output coupled to the ADC, and a first high-pass filter; and a controller coupled to the transmitter path and to the receiver path, where the controller is configured to: cause a corner frequency of the first high-pass filter to increase from a first value to a second value, simultaneously or after causing the corner frequency of the first high-pass filter to increase, cause the transmitter path to be enabled, and after a first signal begins transmission in the enabled transmitter path, and during transmission of the first signal in the enabled transmitter path, cause the corner frequency of the first high-pass filter to decrease from the second value to the first value.

In accordance with an embodiment, a radar system includes: an analog-to-digital converter (ADC); a transmitter path including a power amplifier configured to transmit a plurality of chirps; a receiver path including: a low-noise amplifier (LNA) configured to receive a plurality of reflected chirps, the LNA including an output, a mixer having a first input coupled to the output of the LNA, a second input coupled to the transmitter path, and an output, and a first amplifier including: an input coupled to the output of the mixer, an output coupled to the ADC, and a first high-pass filter; and a controller coupled to the transmitter path and to the receiver path, where the controller is configured to: cause a corner frequency of the first high-pass filter to increase from a first value to a second value, simultaneously or after causing the corner frequency of the first high-pass filter to increase, cause the transmitter path to be enabled, and after a first chirp of the plurality of chirps begins transmission in the enabled transmitter path, and during transmission of the first chirp in the enabled transmitter path, cause the corner frequency of the first high-pass filter to decrease from the second value to the first value.

In accordance with an embodiment, a method includes: increasing a corner frequency of a first high-pass filter of a first amplifier in a receiver path of a transceiver from a first value to a second value; simultaneously or after increasing the corner frequency of the first high-pass filter, enabling a transmitter path of the transceiver; transmitting a first signal in the transmitter path after the transmitter path is enabled; and after the first signal begins transmission in the transmitter path, and during transmission of the first signal in the transmitter path, decreasing the corner frequency of the first high-pass filter from the second value to the first value.

BRIEF DESCRIPTION OF THE DRAWINGS

For a more complete understanding of the present invention, and the advantages thereof, reference is now made to the following descriptions taken in conjunction with the accompanying drawings, in which:

FIG. 8 illustrates a flow chart of an embodiment method for cross-coupling interference mitigation in a millimeter-wave radar system, according to an embodiment of the present invention.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
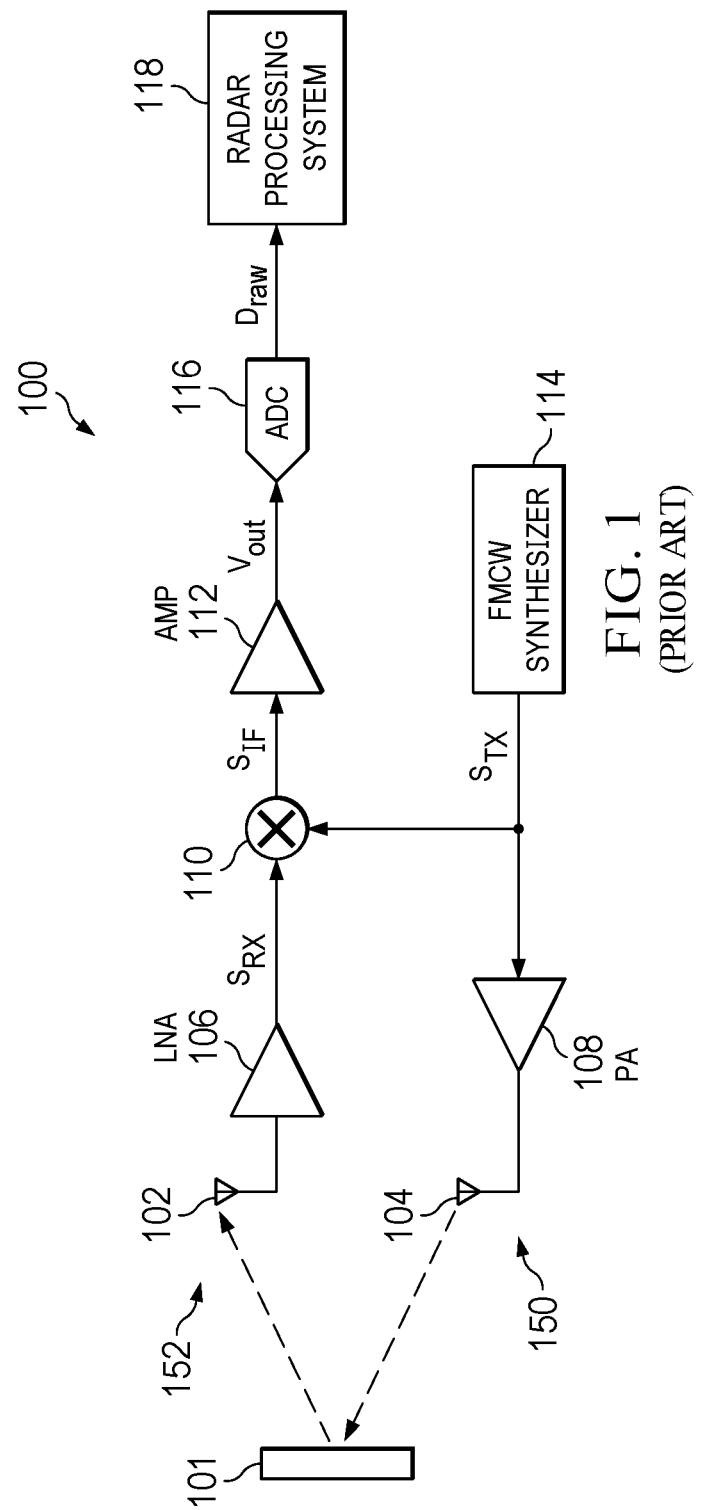
FIG. 1 shows a schematic diagram of an exemplary millimeter-wave radar system.

The making and using of the embodiments disclosed are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

Embodiments of the present invention will be described in specific contexts, e.g., an intermediate frequency (IF) or baseband (e.g., transimpedance) amplifier in a receiver path of a millimeter-wave radar, e.g., for automotive applications. Embodiments of the present invention may be used in other types of application, such as industrial and consumer applications. Some embodiments may be used in systems different from radar, such as wireless communication systems (e.g., Bluetooth, WiFi, 5G, etc.).

In an embodiment of the present invention, a high-pass corner frequency of a high-pass filter of a receiver path of a millimeter-wave radar system is temporarily increased, in a controlled manner and without any instabilities, during the beginning of each chirp to reduce the impact of self-coupling when a transmitter path of the millimeter-wave radar system is enabled. In some embodiments, the high-pass corner frequency is increased at the beginning of each chirp by turning on a switch that connects a first resistance in parallel with a second resistance of the high-pass filter, where the first resistance is (e.g., substantially) smaller than the second resistance. In some embodiments, the high-pass corner frequency is decreased by opening the switch after a settling time. By temporarily increasing the high-pass corner frequency during the beginning of each chirp, some embodiments advantageously reduce the settling time of the IF amplifier, which may advantageously increase the usable operating bandwidth of the millimeter-wave radar system and may advantageously allow for reducing the pulse repetition time and increasing the maximum detection velocity.

Figure 2A:
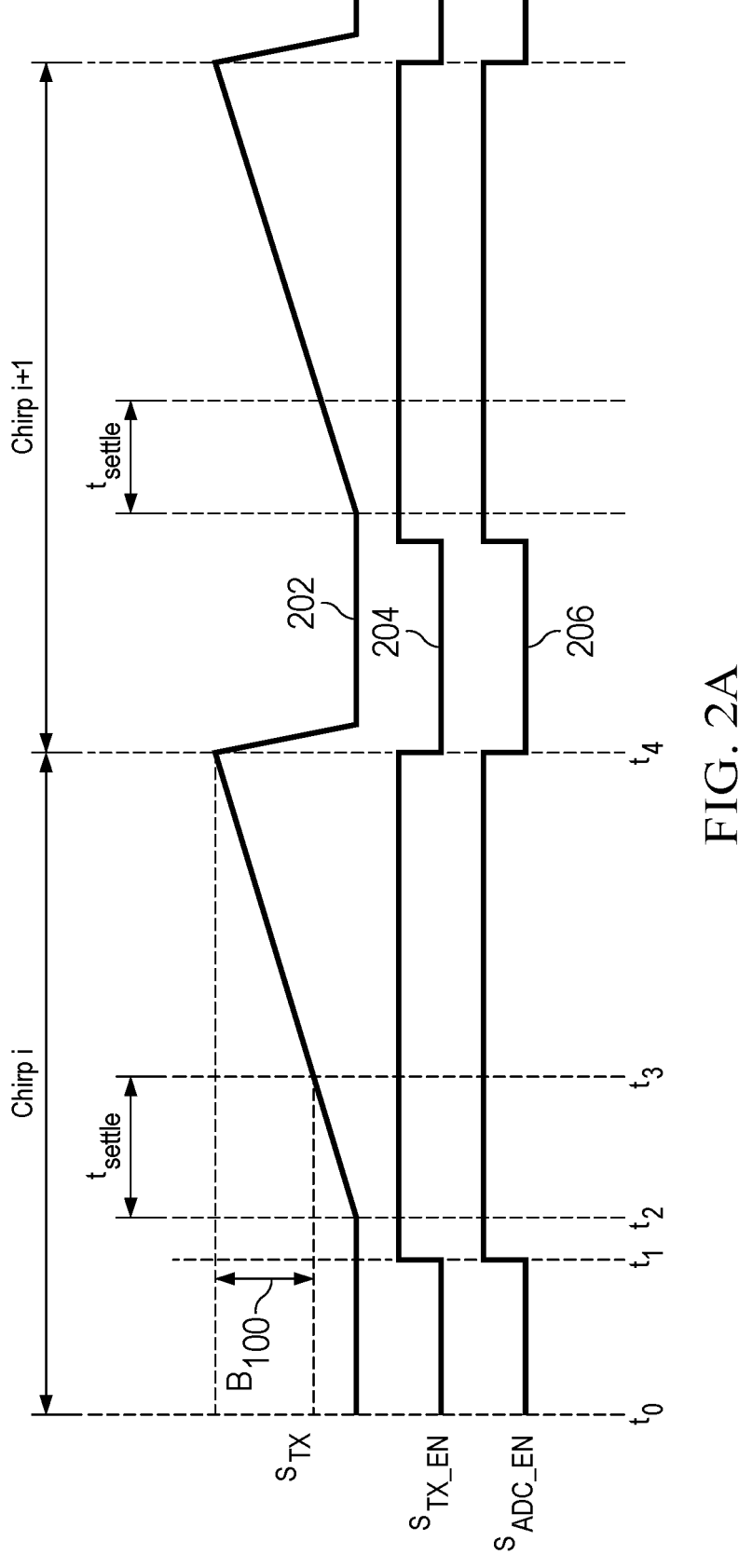
FIGS. 2A and 2B illustrate exemplary waveforms associated with the radar system of FIG. 1.
Figure 2B:
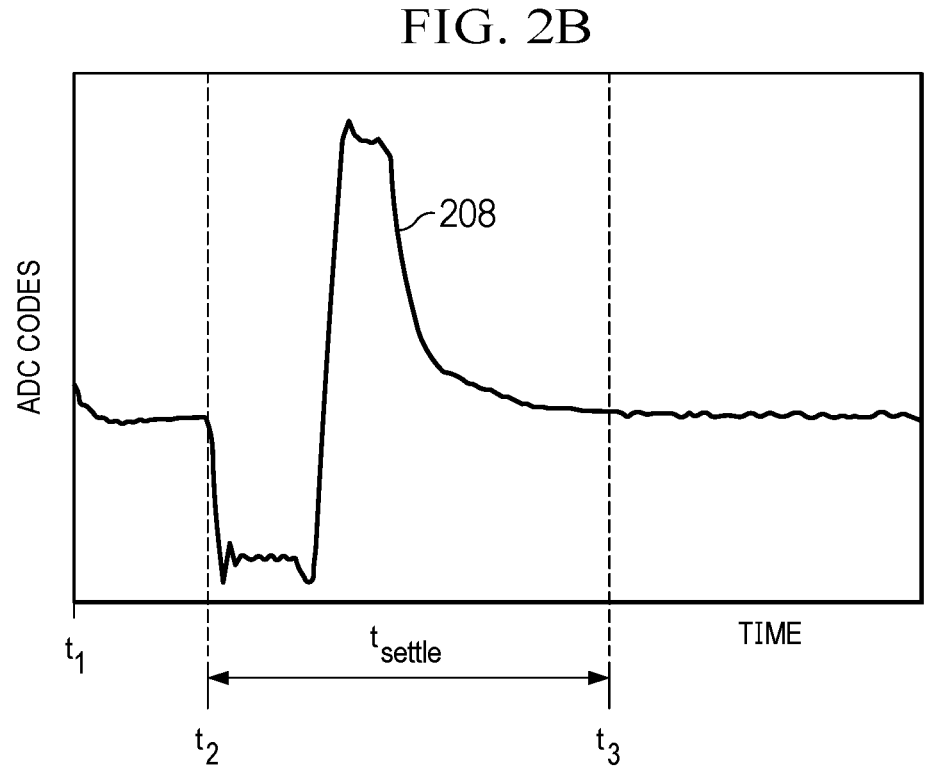

Power amplifier 108 may be periodically turned off (e.g., after each chirp), e.g., to save power and, e.g., to avoid thermal reliability due to self-heating. Each time power amplifier 108 is enabled (e.g., at the beginning of each chirp), cross-coupling between transmitter path 150 (which includes the transmission path from the output of FMCW synthesizer 114 to antenna 104) and receiver path 152 (which includes the transmission path from antenna 102 to the input of mixer 110) may cause signal $S_{IF}$ to exhibit strong (high amplitude) values at the low-frequency spectrum which may saturate the ADC 116 for a period of time. For example. FIGS. 2A and 2B illustrate exemplary waveforms associated with radar system 100. Curve 202 illustrates the frequency of signal $S_{TX}$ over time. Curves 204 and 206 illustrate the digital state of signals $S_{TX\_EN}$ and $S_{ACD\_EN}$, respectively, over time. Curve 208 shows the ADC codes of ADC 116 over time.

As shown in FIG. 2A, once one or more circuits (e.g., 108) of transmitter path 150 are enabled (e.g., when signal $S_{TX\_EN}$ is asserted, e.g., high), a (e.g., up) chirp i is transmitted in signal $S_{TX}$ by FMCW synthesizer 114. Once transmission of the chirp i is complete, the circuits of transmitter path 150 are turned off (e.g., when signal $S_{TX\_EN}$ is deasserted, e.g., low). The next chirp i+1 is transmitted next following a similar process.

As shown in FIG. 2B, transmission of a chirp in signal $S_{TX}$ may result in energy transfer via cross-coupling from signal $S_{TX}$ (or associated signal in transmitter path 150) to receiver path 152, resulting in saturation of ADC 116 (during the period of time $t_{settle}$). Thus, data $D_{raw}$ produced by ADC 116 during the period of time $t_{settle}$ may not be useful. Useful samples of data $D_{raw}$ (e.g., between times $t_3$ and $t_4$ of each chirp) may be further processed by radar processing system 118.

In an embodiment of the present invention, the saturation time of an ADC during the beginning of each chirp resulting from cross-coupling when a transmitter path is enabled is reduced by temporarily increasing the high-pass corner frequency of a high-pass filter of an amplifier having an output coupled to the ADC. By reducing the saturation time of the ADC, some embodiments are advantageously capable of reducing the pulse repetition time (e.g., the time between $t_0$ and $t_4$ in FIG. 2A), and advantageously increase the number of usable samples per chirp (and thus, increase the effective bandwidth of the millimeter-wave radar system).

Figure 3:
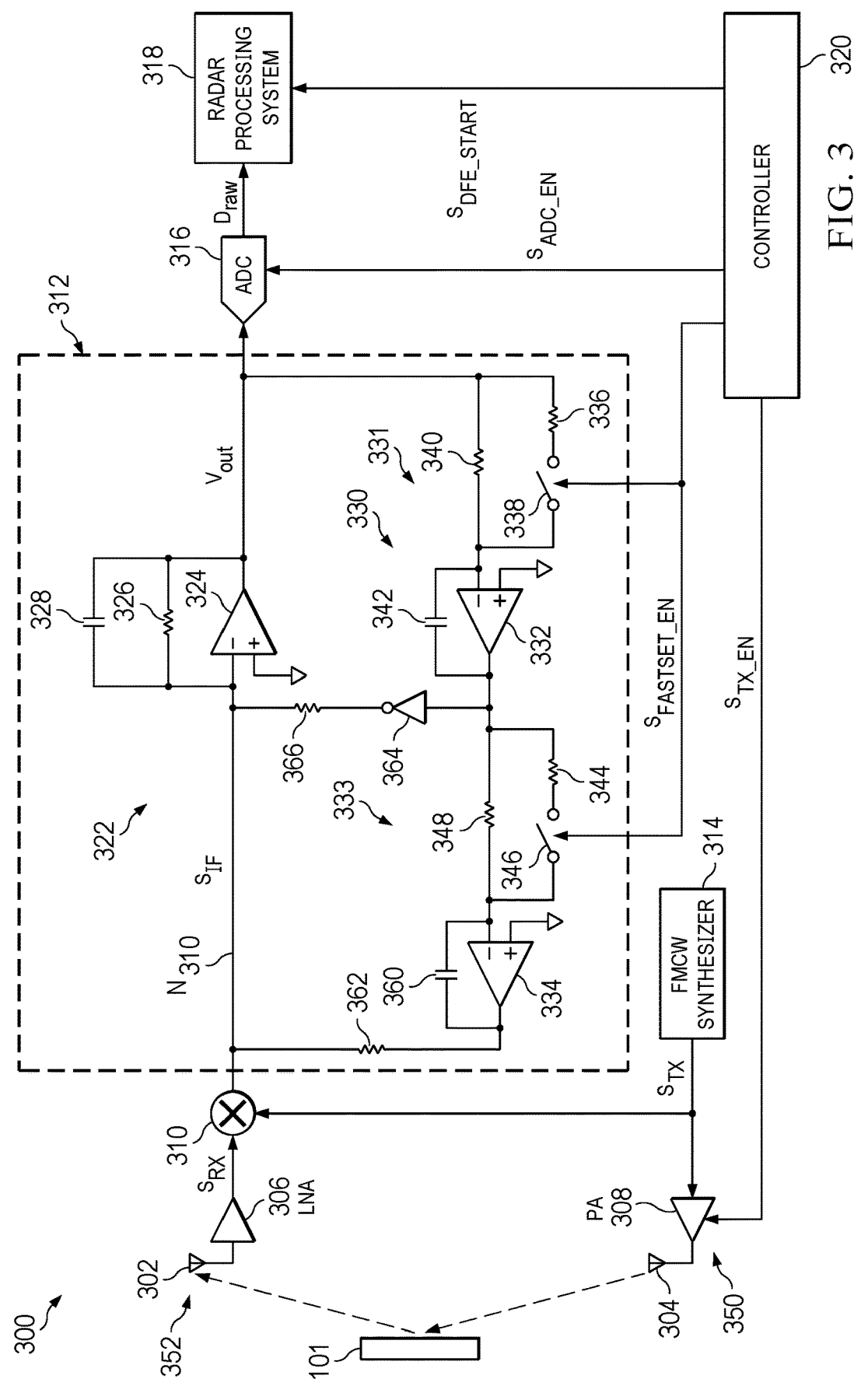
FIG. 3 shows a schematic diagram of a millimeter-wave radar system, according to an embodiment of the present invention.

FIG. 3 shows a schematic diagram of millimeter-wave radar system 300, according to an embodiment of the present invention. Millimeter-wave radar system 300 includes controller 320, transmitter path 350, receiver path 352, ADC 316, and radar processing system 318. Transmitter path 350 includes FMCW synthesizer 314 and power amplifier 308. Receiver path 352 includes LNA 306, mixer 310, and amplifier 312. Additional example details of an amplifier in a radar system can be found in commonly assigned U.S. patent application Ser. No. 17/566,047, entitled "Intermediate Frequency Amplifier with a Configurable High-Pass Filter," filed on Dec. 30, 2021, which is incorporated by reference in its entirety.

Figure 4A:
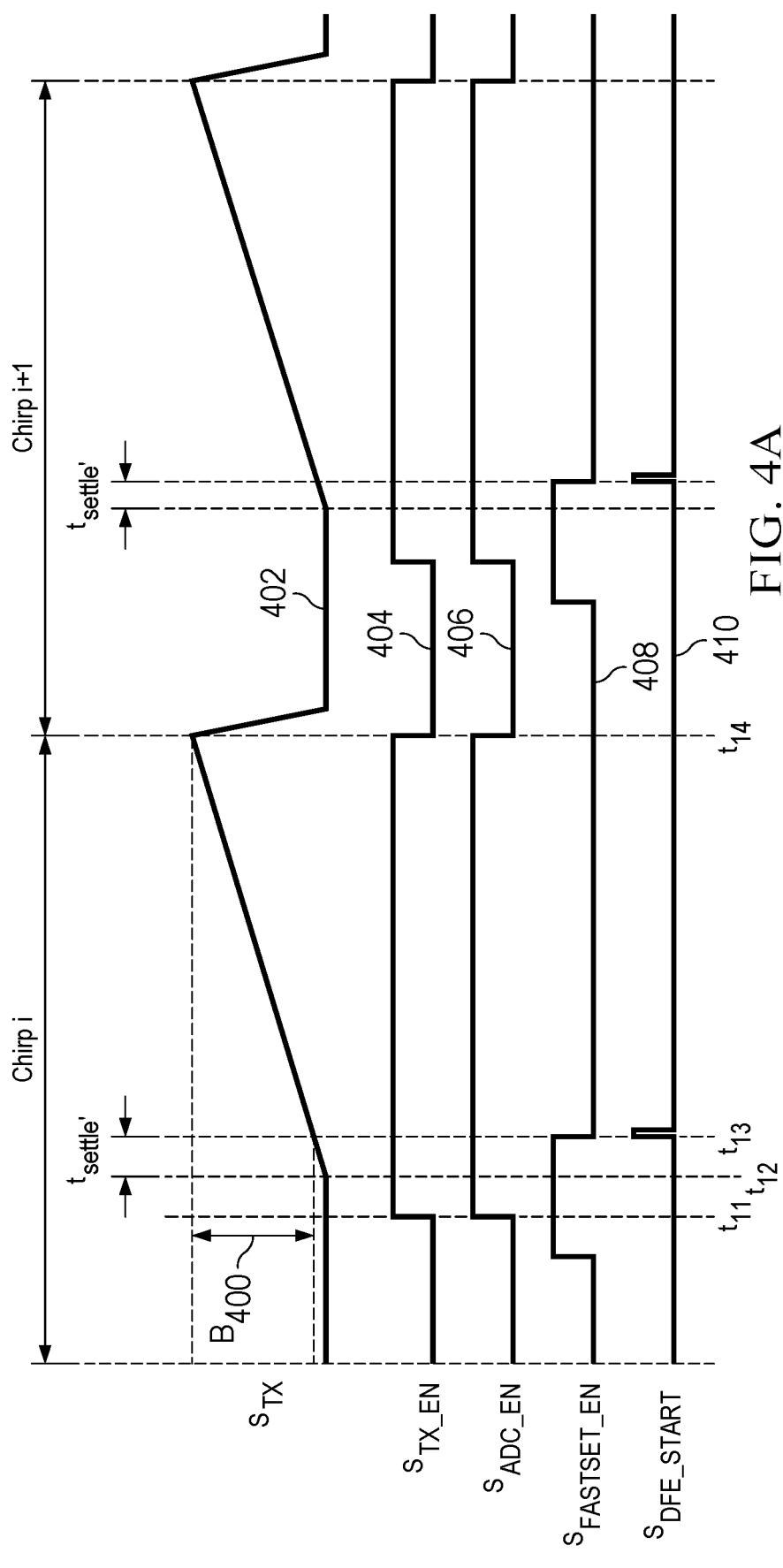
FIGS. 4A and 4B illustrate waveforms associated with the radar system of FIG. 3, according to an embodiment of the present invention.
Figure 4B:
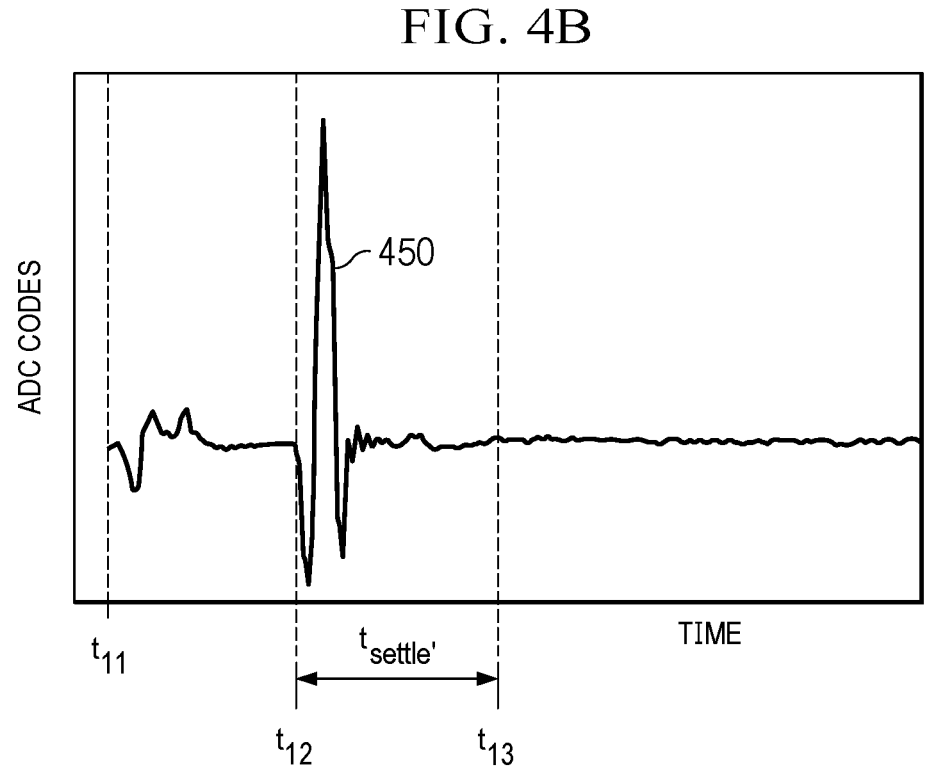

FIGS. 4A and 4B illustrate waveforms associated with radar system 300, according to an embodiment of the present invention. Curve 402 illustrates the frequency of signal $S_{TX}$ over time. Curves 404, 406, 408, and 410 illustrate the digital state of signals $S_{TX\_EN}$, $S_{ACD\_EN}$, $S_{FASTSET\_EN}$ and $S_{DFE\_START}$, respectively, over time. Curve 450 shows the ADC codes of ADC 316 over time. FIGS. 3, 4A, and 4B may be understood together.

During normal operation, FMCW synthesizer 314 generates transmitter signal $S_{TX}$, which includes (e.g., up) chirps, as shown by curve 402. The transmitter signal $S_{TX}$ is transmitted by power amplifier (PA) 308 via transmitting antenna 304 towards objects in the field of view of radar system 300. The chirps transmitted by transmitting antenna 304 are reflected by objects (e.g., 101) in the field-of-view of radar system 300, and are received by receiving antenna 302. The reflected chirps received by receiving antenna are amplified by low-noise amplifier (LNA) 306 to generate receiver signal $S_{RX}$. The transmitter signal $S_{TX}$ and receiver signal $S_{RX}$ are mixed by mixer 310 to generate intermediate frequency signal $S_{IF}$. Intermediate frequency signal $S_{IF}$ is amplified and filtered by amplifier 312 to generate output voltage $V_{out}$. Output voltage $V_{out}$ is digitized using analog-to-digital converter (ADC) 316 to generate raw radar digital data $D_{raw}$. Data $D_{raw}$ is then processed by radar processing system 318, e.g., to detect, track, identify, and/or classify targets.

As shown in FIG. 3, in some embodiments, amplifier 312 may be implemented with forward path 322 and feedback path 330. Forward path 322 includes gain amplifier 324. Feedback path 330 includes high-pass filters 331 and 333 (which in some embodiments form a second-order high-pass filter). As shown in FIG. 3, in some embodiments, output $V_{out}$ is fed back, high-pass filtered by high-pass filters 331 and 333, and subtracted from node $N_{310}$, which may remove high-frequency content from signal $S_{IF}$, thereby removing such high frequency content from signal $V_{out}$. For example, as shown in FIG. 3, the output signal from high-pass filter 331 is inverted by inverting unity gain buffer 364 and injected into node $N_{310}$, and is also inverted by high-pass filter 333 and injected into node $N_{310}$, thereby causing the outputs from inverting buffer 364 and amplifier 334 to be subtracted from node $N_{310}$.

As shown in FIG. 4A, in some embodiments, the transmitter path 350 (e.g., circuit 308 or a portion thereof) may be enabled (e.g., by asserting signal $S_{TX\_EN}$, e.g., high) for chirp transmission and disabled (e.g., by deasserting signal $S_{TX\_EN}$, e.g., low) between chirps, which may advantageously reduce power consumption.

In some embodiments, upon re-enablement of the transmitter path 350 (when signal $S_{TX\_EN}$ is asserted) and transmission of a chirp, cross-coupling may occur between the transmitter path 350 and the receiver path 352 that may temporarily saturate the ADC 316, as shown by curve 450. In some embodiments, the time that ADC 316 remains saturated depends on the corner frequency of high-pass filters 331 and 333. For example, in some embodiments, a higher corner frequency of filters 331 and 333 (with switches 346 and 338 closed) may reduce the energy storage capability of filters 331 and 333 and thus may advantageously reduce the time that ADC 316 remains saturated upon re-enablement of transmitter path 350.

In some embodiments, switches 346 and 338 are closed by asserting signal $S_{FASTSET\_EN}$ on or before the beginning of each chirp to reduce the time that ADC 316 remains saturated upon re-enablement of transmitter path 350. Once ADC 316 is no longer saturated, switches 346 and 338 are opened (by deasserting signal $S_{FASTSET\_EN}$ at time $t_{13}$) for the reminder of the chirp, thereby advantageously increasing the bandwidth of signal $S_{IF}$ (by lowering the corner of the high-pass filters 331 and 333) during the useful portions of data $D_{raw}$. For example, as illustrated in FIGS. 3 and 4A, in some embodiments, signal $S_{FASTSET\_EN}$ is asserted before signal $S_{TX\_EN}$ is asserted, thereby causing switches 346 and 338 to be closed before transmitter path 350 is enabled at time $t_{11}$. At time $t_{13}$, once ADC 316 is no longer saturated, signal $S_{FASTSET\_EN}$ is deasserted (to open switches 346 and 338) and signal $S_{DFE\_START}$ is pulsed to mark the beginning of the useful (e.g., non-saturated) ADC samples of data $D_{raw}$. In some embodiments, as shown in FIG. 4B, the settling time $t_{settle'}$ (between time $t_{12}$ and $t_{13}$) for ADC 316 to become not saturated is (e.g., substantially) shorter than without closing switches 346 and 338. For example, in some embodiments, settling time $t_{settle'}$ may be about 1.5 µs when closing switches 346 and 338 (as shown by curve 408), and may be about 6 µs without closing switches 346 and 338 (e.g., by keeping signal $S_{FASTSET\_EN}$ low).

In some embodiments, the duration of the $S_{FASTSET\_EN}$ pulse (e.g., the duration in which $S_{FASTSET\_EN}$ pulse is asserted, e.g., high), and the start time of the $S_{FASTSET\_EN}$ pulse, are programmable.

$$d_{res} = \frac{c}{2B} cB$$

In some embodiments, by reducing the settling time (e.g., by closing switches 346 and 338 at or before the beginning of each chirp), some embodiments, advantageously exhibit a larger bandwidth $B_{400}$, since the time between time $t_{13}$ and $t_{14}$ is longer when compared with a longer settling time. A larger bandwidth $B_{400}$ may advantageously result in better range resolution, e.g., following the relationship $$d_{res} = \frac{c}{2B} cB,$$

where $d_{res}$ represents the range resolution, represents the speed of light, and represents the chirp bandwidth.

FMCW synthesizer 314 is configured to generate transmitter signal $S_{TX}$ and provide such transmitter signal $S_{TX}$ to power amplifier 308. In some embodiments, the transmitter signal $S_{TX}$ include up-chirps. In some embodiments, the transmitter signal $S_{TX}$ include down-chirps. In some embodiments, FMCW synthesizer 314 may be implemented in any way known in the art.

In some embodiments, the chirps generated by FMCW synthesizer 314 may have a start and end frequency of 76 GHz and 81 GHZ, respectively. Other frequencies may also be used. For example, in some embodiments, the chirps generated by FMCW synthesizer 314 may have a start and end frequency of 57 GHz and 64 GHZ, respectively.

In some embodiments, power amplifier 308 is configured to transmit radar signals (based on, such as by amplifying, signal $S_{TX}$) via transmitting antenna 304. In some embodiments, power amplifier 308 may be implemented in any way known in the art.

In some embodiments, LNA 306 is configured to receive reflected radar signals via receiving antenna 302, and provide an amplified (and, e.g., filtered) reflected signal $S_{RX}$ to mixer 310. In some embodiments, LNA 306 may be implemented in any way known in the art.

In some embodiments, mixer 310 is configured to mix signals $S_{TX}$ and $S_{RX}$ to produce intermediate frequency signal $S_{IF}$. In some embodiments, signal $S_{IF}$ is a current signal. In some embodiments, signal $S_{IF}$ is a voltage signal. In some embodiments, mixer 310 may be implemented in any way known in the art.

In some embodiments, ADC 316 is configured to receive voltage $V_{out}$ from amplifier 312, and provide digital code(s) based on the voltage $V_{out}$. In some embodiments, ADC 316 may be enabled when signal $S_{ADC\_EN}$ is asserted (e.g., high) and disabled when signal $S_{ADC\_EN}$ is deasserted (e.g., low). In some embodiments, ADC 316 may be implemented in any way known in the art.

In some embodiments, radar processing system 318 is configured to process digital data $D_{raw}$, e.g., to detect, identify, track, and/or classify targets. In some embodiments, radar processing system 318 may process data $D_{raw}$ based on signal $S_{DFE\_START}$. For example, in some embodiments, for each chirp, data $D_{raw}$ received after signal $S_{DFE\_START}$ is asserted (e.g., pulsed) may be processed while data received before signal $S_{DFE\_START}$ is asserted may be corrupted (e.g., saturated) and may be ignored. For example, in some embodiments, data $D_{raw}$ generated by ADC 316 and/or received by radar processing system 318 before signal $S_{DFE\_START}$ is asserted is discarded.

In some embodiments, radar processing system 318 may include a generic or custom controller or processor coupled to a memory and configured to execute instructions stored in such memory. Other implementations are also possible.

In some embodiments, controller 320 is configured to control or provide input(s) to circuits of millimeter-wave radar system 300, such as circuits 308, 314, 312, 316, and 318. For example, controller 320 may be configured to assert and deassert the signals $S_{TX}$, $S_{FASTSET\_EN}$, $S_{ADC\_EN}$, and/or $S_{DFE\_START}$. The controller 320 can deliver these signals to the circuits 308, 312, 316, and 318 as shown in FIG. 3. Through control of one or more of these signals, controller 320 may be configured to enable and/or disable circuits 308, 312, 314, 316, and/or 318. As an example, controller 320 may be configured to enable or disable transmitter path 350 by controlling the signal $S_{TX}$. As another example, controller 320 may be configured to activate or deactivate switches 338, 346, 660, 662, 664, and 666 by controlling the signal $S_{FASTSET\_EN}$. In some embodiments, controller 320 may include a generic or custom controller or processor coupled to a memory and configured to execute instructions stored in such memory. In some embodiments, controller 320 may include a finite state machine. Other implementations are also possible.

This disclosure has attributed functionality to radar system 300 and controller 320. Radar system 300 and Controller 320 may include processing circuitry such as one or more processors. Radar system 300 and Controller 320 may include any combination of integrated circuitry, discrete logic circuitry, analog circuitry, such as one or more microprocessors, microcontrollers, digital signal processors, application specific integrated circuits, central processing units, graphics processing units, field-programmable gate arrays, and/or any other processing resources. In some examples, radar system 300 and controller 320 may include multiple components, such as any combination of the processing resources listed above, as well as other discrete or integrated logic circuitry, and/or analog circuitry.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

In some embodiments, IF amplifier 312 is configured to amplify and filter signal $S_{IF}$ to generate output voltage $V_{out}$. As shown, in some embodiments, IF amplifier 312 includes forward path 322 and feedback path 330.

In some embodiments, forward path 322 includes amplifier 324, resistor 326 and capacitor 328. In some embodiments, amplifier 324, resistor 326 and capacitor 328 form a low-pass filter (with a corner frequency higher than the corner frequency of high-pass filters 331 and 333). In some embodiments, amplifier 326 has a gain with a magnitude higher than 1.

In some embodiments, feedback path 330 includes high-pass filters 331 and 333. High-pass filter 331 includes amplifier 332, capacitor 342, and resistors 336 and 340. High-pass filter 333 includes amplifier 334, capacitor 360, and resistors 344 and 348.

In some embodiments, the resistance of resistor 336 is substantially (e.g., an order of magnitude) smaller than the resistance of resistor 340. In some embodiments, the resistance of resistor 344 is substantially (e.g., an order of magnitude) smaller than the resistance of resistor 348. For example, in some embodiments, the resistances of resistors 336, 340, 348, and 344 are 15 kΩ, 150 kΩ, 284 kΩ and 28.4 kΩ, respectively. In some embodiments, the resistances of resistors 344 and 336 is equal.

As shown in FIG. 3, in some embodiments, amplifiers 324, 332 and 334 may be implemented as single-ended amplifiers. In some embodiments, amplifiers 324, 332, and 334 may be implemented as differential amplifiers.

In some embodiments, switches 346 and 338 are configured to close (turn on or activate) when signal $S_{FASTSET\_EN}$ is asserted (e.g., high) and open (turn off or deactivate) when signal $S_{FASTSET\_EN}$ is deasserted (e.g., low). In some embodiments, switches 346 and 338 may be implemented in any way known in the art, such as with transistors, for example.

In some embodiments, buffer 364 is configured to invert and buffer, with unity gain, the signal from the output of amplifier 332 into resistor 366. In some embodiments, the gain of buffer 364 may be different from 1. In some embodiments, buffer 364 may be implemented in any way known in the art.

In some embodiments in which signal $S_{IF}$ is a current, amplifier 324 may be implemented as a transimpedance amplifier (TIA). For example, in some embodiments in which signal $S_{IF}$ is a current (e.g., labeled as $I_{IF}$), amplifier 324 is implemented as a transimpedance amplifier that generates output voltage $V_{out}$ proportional to the current $I_{IF}$ (e.g., with a gain having a magnitude higher than 1).

Figure 5:
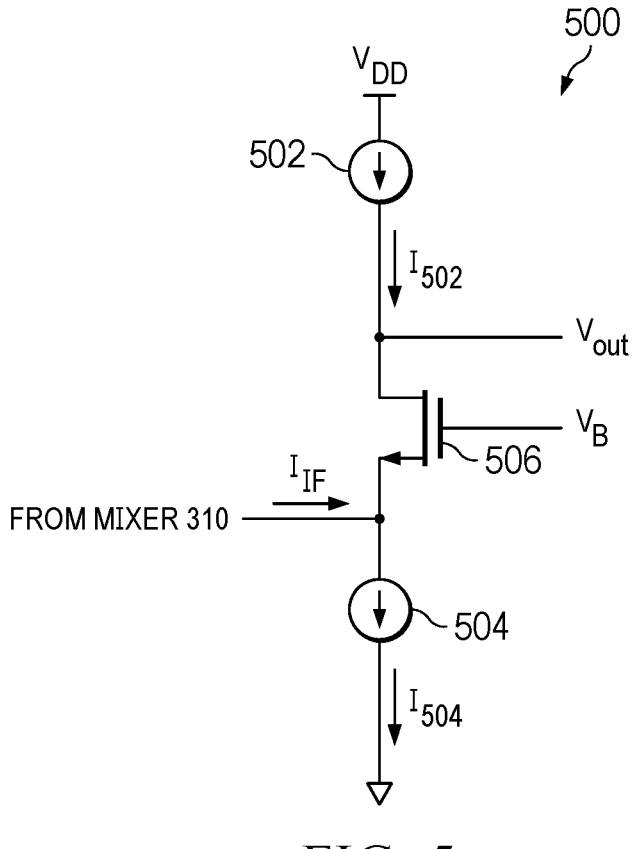
FIG. 5 shows a schematic diagram of a transimpedance amplifier, according to an embodiment of the present invention.

FIG. 5 shows a schematic diagram of transimpedance amplifier 500, according to an embodiment of the present invention. In some embodiments implementing signal $S_{IF}$ with a current, amplifier 324 may be implemented as transimpedance amplifier 500.

During normal operation, transistor 506 is biased with bias voltage $V_B$, and voltage $V_{out}$ is proportional to current $I_{IF}$, where the transconductance $g_m$ of transimpedance amplifier 500 is based on the currents 1502 and 1504 generated by current sources 502 and 504, respectively.

Figure 6:
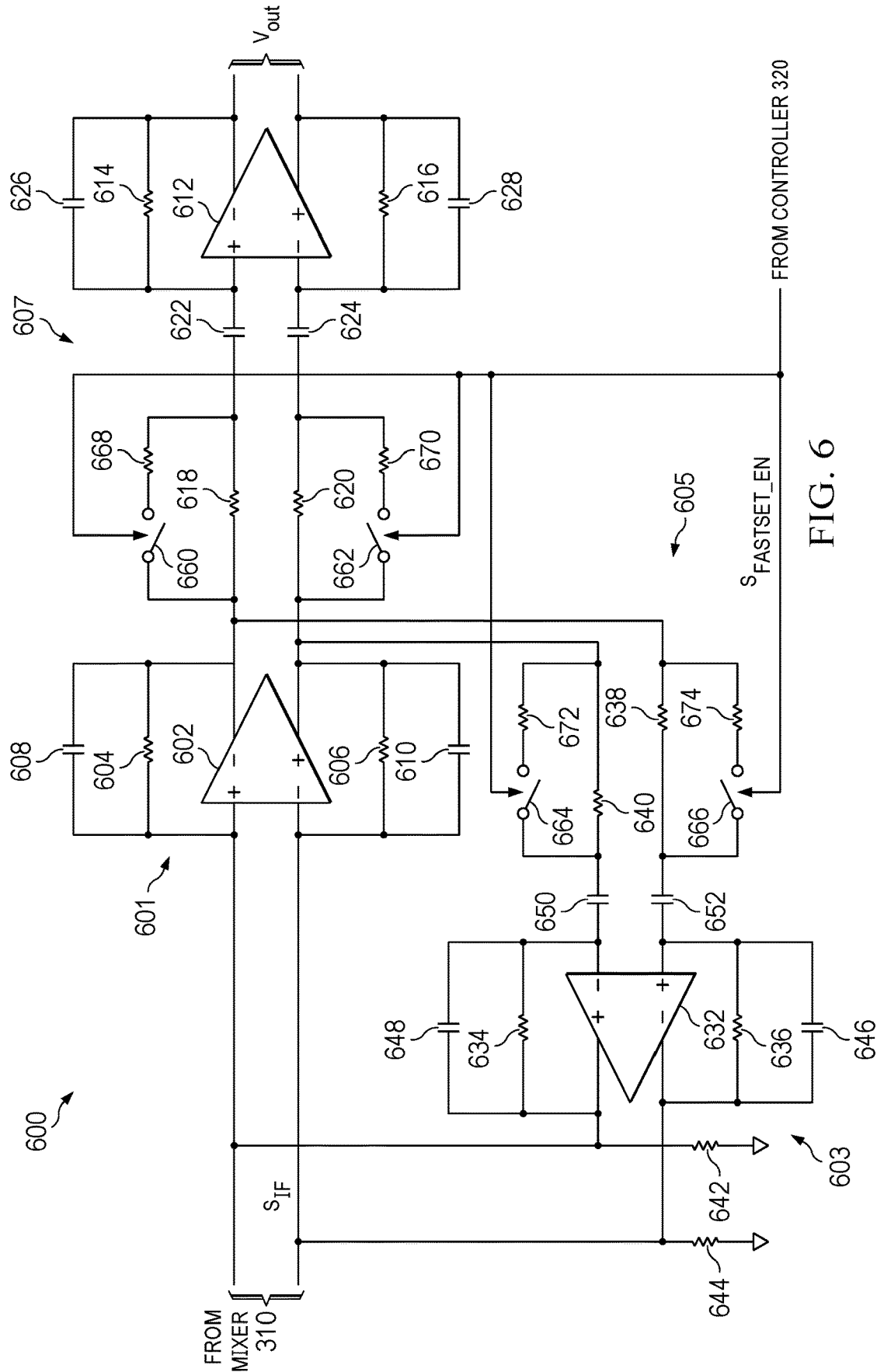
FIG. 6 shows a schematic diagram of an amplifier, according to an embodiment of the present invention.

As shown in FIG. 3, in some embodiments, the high-frequency filters (e.g., 331, 333) are implemented as part of the feedback path 330. In some embodiments, one or more high-pass filters may be implemented in the forward path instead of the feedback path. For example, FIG. 6 shows a schematic diagram of amplifier 600, according to an embodiment of the present invention. In some embodiments, amplifier 312 may be implemented as amplifier 600.

In some embodiments, amplifier 600 operates in a similar manner as amplifier 312 and the waveforms illustrated in FIG. 4A may be associated with amplifier 600. Amplifier 600, however, includes high-pass filter 607 as part of forward path 601 and high pass filter 605 as part of the feedback path 603.

As shown in FIG. 6, in some embodiments, switches 660, 662, 664, and 666 are closed at or before the beginning of each chirp and may be opened after the ADC 316 is no longer in saturation (e.g., at time $t_{13}$).

As shown in FIG. 6, amplifiers 602, 612 and 632 are differential amplifiers. In some embodiments, amplifiers 602, 612 and 632 may be implemented as single-ended amplifiers.

In some embodiments, the resistance of resistors 668, 670, 672, and 674 are substantially (e.g., an order of magnitude) smaller than the resistance of resistors 618, 620, 640, and 638, respectively. In some embodiments, the resistances of resistors 668, 670, 672, and 674 are equal to each other.

Advantages of some embodiments include the ability to reduce the time that IF amplifier and ADC are saturated as a result of cross-coupling between the transmitter path and the receiver path, thereby advantageously allowing for shorter repetition times, higher bandwidth, and a higher number of useful ADC samples for each chirp without substantially affecting other performance metrics (such as retaining the ability to detect close-in objects) and without substantially increasing the silicon or package area. In addition, the techniques of this disclosure may be implemented in a radar system without increasing the power dissipation.

As described above, some embodiments may be implemented in millimeter-wave radar systems (e.g., 300). Some embodiments may be implemented in other types of systems, such as wireless communication systems such as Bluetooth and WiFi systems. For example, in some embodiments, cross-coupling between a transmitter and receiver path of a Bluetooth transceiver resulting from enabling the transmitter path (e.g., during wake-up of the transceiver) may be reduced by using an amplifier 312 in the receiver path of the Bluetooth transceiver, asserting signal $S_{FAST\_SET\_EN}$ at or before the transmitter path is enabled, and deasserting signal $S_{FASTSET\_EN}$ after the amplifier 312 is no longer saturated.

Figure 7:
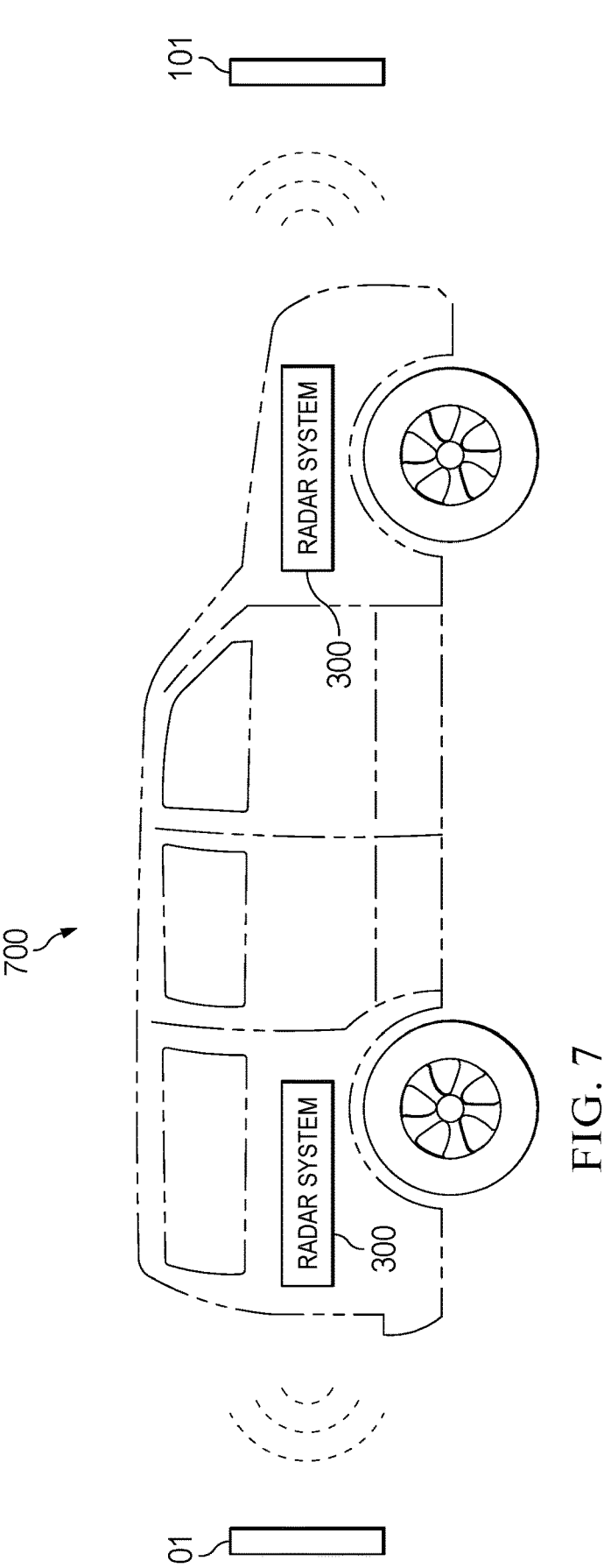
FIG. 7 illustrates an automotive vehicle, according to an embodiment of the present invention.

FIG. 7 illustrates automotive vehicle 700, according to an embodiment of the present invention. Vehicle 700 includes millimeter-wave radar system 300 (or 600). In some embodiments, radar system 300 (or 600), may be used to detect and track pedestrians, other vehicles, and/or other objects associated with driving in a road (e.g., sidewalks, street lights, etc.).

As illustrated in FIG. 7, vehicle 700 may include one or more radar systems 300, such as one or more radar systems 300 in the front of vehicle 700, one or more radar systems 300 in the read of vehicle 700, and/or one or more radar systems 300 in the sides of vehicle 700.

FIG. 8 illustrates a flow chart of embodiment method 800 for cross-coupling interference mitigation in a millimeter-wave radar system, according to an embodiment of the present invention. Method 800 may be implemented, e.g., by millimeter-wave radar system 300.

During step 802, a corner frequency of a high-pass filter (e.g., 331, 333, 605, 607) of a first amplifier (e.g., 312, 600) in a receiver path (e.g., 352) of a transceiver of a millimeter-wave radar system (e.g., 300) is increased from a first value to a second value.

During step 804, simultaneously or after performing step 802, a transmitter path (e.g., 350) of the millimeter-wave radar system is enabled (e.g., by asserting signal $S_{TX\_EN}$). In some embodiments, enabling the transmitter path includes enabling a power amplifier (e.g., 308) of the transmitter path.

During step 806, and after the transmitter path is enabled, a first signal (e.g., a chirp) is transmitted in the transmitter path, e.g., using the power amplifier and via an antenna (e.g., 304).

During step 808, and during transmission of the first signal in the transmitter path, the corner frequency of the high-pass filter is decreased (e.g., from the second value to the first value).

Example embodiments of the present invention are summarized here. Other embodiments can also be understood from the entirety of the specification and the claims filed herein.

Example 1. A system including: an analog-to-digital converter (ADC); a transmitter path; a receiver path including a first amplifier including: an output coupled to the ADC, and a first high-pass filter; and a controller coupled to the transmitter path and to the receiver path, where the controller is configured to: cause a corner frequency of the first high-pass filter to increase from a first value to a second value, simultaneously or after causing the corner frequency of the first high-pass filter to increase, cause the transmitter path to be enabled, and after a first signal begins transmission in the enabled transmitter path, and during transmission of the first signal in the enabled transmitter path, cause the corner frequency of the first high-pass filter to decrease from the second value to the first value.

Example 2. The system of example 1, where the controller is further configured to disable the transmitter path after the first signal finishes transmission in the enabled transmitter path.

Example 3. The system of one of examples 1 or 2, where the first high-pass filter includes: a second amplifier having a first input, and an output; a first resistor coupled to the first input of the second amplifier; and a second resistor and a first switch coupled in series and further coupled to the first input of the second amplifier, where the controller is configured to: cause the corner frequency of the first high-pass filter to increase by causing the first switch to close (e.g., activating the first switch), and cause the corner frequency of the first high-pass filter to decrease by causing the first switch to open (e.g., deactivating the second switch).

Example 4. The system of one of examples 1 to 3, where a resistance of the second resistor is smaller than a resistance of the first resistor.

Example 5. The system of one of examples 1 to 4, where the second amplifier is a differential amplifier.

Example 6. The system of one of examples 1 to 5, where the second amplifier is a single-ended amplifier.

Example 7. The system of one of examples 1 to 6, where the first amplifier further includes: a third amplifier having an output coupled to the output of the first amplifier, and a first input coupled to an input of the first amplifier; and a third resistor coupled between the first input of the third amplifier and the output of the third amplifier.

Example 8. The system of one of examples 1 to 7, where the first input of the second amplifier is coupled to the output of the third amplifier, and the output of the second amplifier is coupled to the output of the first amplifier.

Example 9. The system of one of examples 1 to 8, where the first input of the second amplifier is coupled to the output of the third amplifier, and the output of the second amplifier is coupled to the first input of the second amplifier.

Example 10. The system of one of examples 1 to 9, where the third amplifier is a transimpedance amplifier.

Example 11. The system of one of examples 1 to 10, where the first amplifier further includes a first capacitor coupled in parallel with the third resistor, a second capacitor coupled between the first input of the second amplifier and the output of the second amplifier.

Example 12. The system of one of examples 1 to 11, where the first inputs of the second and third amplifiers are inverting inputs.

Example 13. The system of one of examples 1 to 12, where the first amplifier further includes a second high-pass filter having an output coupled to the output of the first amplifier, and an input coupled to an input of the first amplifier, where the first high-pass filter includes an input coupled to the input of the second high-pass filter, and an output coupled to the input of the first amplifier.

Example 14. The system of one of examples 1 to 13, where the controller is further configured to cause a corner frequency of the second high-pass filter to increase when causing the corner frequency of the first high-pass filter to increase, and cause the corner frequency of the second high-pass filter to decrease when causing the corner frequency of the first high-pass filter to decrease.

Example 15. The system of one of examples 1 to 14, where the first amplifier further includes a second high-pass filter having an input coupled to the output of the first amplifier, and an output coupled to an input of the first amplifier, where the first high-pass filter includes an input coupled to the output of the second high-pass filter, and an output coupled to the input of the first amplifier, where the controller is further configured to cause a corner frequency of the second high-pass filter to increase when causing the corner frequency of the first high-pass filter to increase, and cause the corner frequency of the second high-pass filter to decrease when causing the corner frequency of the first high-pass filter to decrease.

Example 16. The system of one of examples 1 to 15, further including a processor configured to receive ADC samples from the ADC, where the processor is configured discard the ADC samples generated while the corner frequency of the first high-pass filter is equal to the second value.

Example 17. The system of one of examples 1 to 16, where the system is a wireless communication system.

Example 18. The system of one of examples 1 to 17, where the system is a millimeter-wave radar system.

Example 19. A radar system including: an analog-to-digital converter (ADC); a transmitter path including a power amplifier configured to transmit a plurality of chirps; a receiver path including: a low-noise amplifier (LNA) configured to receive a plurality of reflected chirps, the LNA including an output, a mixer having a first input coupled to the output of the LNA, a second input coupled to the transmitter path, and an output, and a first amplifier including: an input coupled to the output of the mixer, an output coupled to the ADC, and a first high-pass filter; and a controller coupled to the transmitter path and to the receiver path, where the controller is configured to: cause a corner frequency of the first high-pass filter to increase from a first value to a second value, simultaneously or after causing the corner frequency of the first high-pass filter to increase, cause the transmitter path to be enabled, and after a first chirp of the plurality of chirps begins transmission in the enabled transmitter path, and during transmission of the first chirp in the enabled transmitter path, cause the corner frequency of the first high-pass filter to decrease from the second value to the first value.

Example 20. The radar system of example 19, where the controller is further configured to: cause the transmitter path to be enabled before transmission of each chirp of the plurality of chirps; cause the transmitter path to be disabled after transmission of each chirp of the plurality of chirps; cause the corner frequency of the first high-pass filter to increase before transmission of each chirp; and cause the corner frequency of the first high-pass filter to decrease during transmission of each chirp.

Example 21. The radar system of one of examples 19 or 20, where the radar system is a millimeter-wave radar system.

Example 22. The radar system of one of examples 19 to 21, where the radar system is installed in an automotive vehicle.

Example 23. A method including: increasing a corner frequency of a first high-pass filter of a first amplifier in a receiver path of a transceiver from a first value to a second value; simultaneously or after increasing the corner frequency of the first high-pass filter, enabling a transmitter path of the transceiver; transmitting a first signal in the transmitter path after the transmitter path is enabled; and after the first signal begins transmission in the transmitter path, and during transmission of the first signal in the transmitter path, decreasing the corner frequency of the first high-pass filter from the second value to the first value.

Example 24. The method of example 23, where enabling the transmitter path includes enabling a power amplifier of the transmitter path.

While this invention has been described with reference to illustrative embodiments, this description is not limiting. Various modifications and combinations of the illustrative embodiments, as well as other embodiments of the invention, will be apparent to persons skilled in the art upon reference to the description. The appended claims encompass any such modifications or embodiments.

What is claimed is:
1. A system comprising:
an analog-to-digital converter (ADC);
a transmitter path;
a receiver path comprising:
an output coupled to the ADC, and
a high-pass filter comprising:
an amplifier having an input and an output; and
variable resistive circuitry coupled to the input;
a controller coupled to the transmitter path and to the receiver path, wherein the controller is configurable to:
assert a control signal to the variable resistive circuitry to decrease resistance of the variable resistive circuitry to cause a corner frequency of the high-pass filter to increase from a first value to a second value,
simultaneously or after causing the corner frequency of the high-pass filter to increase, cause the transmitter path to be enabled, and
after a first signal begins transmission in the enabled transmitter path, and during transmission of the first signal in the enabled transmitter path, de-assert the control signal to increase resistance of the variable resistive circuitry to cause the corner frequency of the high-pass filter to decrease from the second value to the first value.

2. The system of claim 1, wherein the controller is further configured to disable the transmitter path after the first signal finishes transmission in the enabled transmitter path.

3. The system of claim 1, wherein the variable resistive circuitry comprises:
a first resistor coupled to the input of the amplifier; and
a second resistor and a switch coupled in series and further coupled to the input of the amplifier, wherein the controller is configurable to:
cause the switch to close in response to asserting the control signal, and
cause the switch to open in response to de-asserting the control signal.

4. The system of claim 3, wherein a resistance of the second resistor is smaller than a resistance of the first resistor.

5. The system of claim 3, wherein the amplifier is a differential amplifier and the input is a first input, the differential amplifier having a second input coupled to ground.

6. The system of claim 3, wherein the amplifier is a single-ended amplifier.

7. The system of claim 1, wherein the high-pass filter is a first high-pass filter, the amplifier is a first amplifier, and the variable resistive circuitry is first variable resistive circuitry, the receiver path further comprising:
a second high-pass filter comprising:
a second amplifier having an input coupled to the output of the first amplifier; and
second variable resistive circuitry coupled to the input of the second amplifier.

8. The system of claim 7, wherein the controller is further configurable to control resistance of the second variable resistive circuitry.

9. The system of claim 7, wherein the receiver path further comprises a third amplifier having an input coupled to an output of the second amplifier and having an output coupled to the input of the first amplifier.

10. The system of claim 9, wherein the third amplifier is a transimpedance amplifier.

11. The system of claim 7, wherein the first amplifier further comprises a first capacitor coupled between the input of the first amplifier and the output of the first amplifier, and the second amplifier comprises a second capacitor coupled between the input of the second amplifier and an output of the second amplifier.

12. The system of claim 7, wherein the inputs of the first and second amplifiers are inverting inputs.

13. The system of claim 1, wherein the high-pass filter is a first high-pass filter, the receiver path further comprising a second high-pass filter having an input coupled to the output of the amplifier.

14. The system of claim 13, wherein the controller is further configured to cause a corner frequency of the second high-pass filter to increase when causing the corner frequency of the first high-pass filter to increase, and cause the corner frequency of the second high-pass filter to decrease when causing the corner frequency of the first high-pass filter to decrease.

15. The system of claim 13, wherein the amplifier is a first amplifier and the variable resistive circuitry is first variable resistive circuitry, the second high-pass filter further comprising a second amplifier, and second variable resistive circuitry coupled to the input of the second high-pass filter.

16. The system of claim 1, further comprising a processor configured to receive ADC samples from the ADC, wherein the processor is configured discard the ADC samples generated while the corner frequency of the high-pass filter is equal to the second value.

17. The system of claim 1, wherein the system is a wireless communication system.

18. The system of claim 1, wherein the system is a millimeter-wave radar system.

19. A radar system comprising:
an analog-to-digital converter (ADC);
a transmitter path comprising a power amplifier configured to transmit a plurality of chirps;
a receiver path comprising:
a low-noise amplifier (LNA) configured to receive a plurality of reflected chirps, the LNA comprising an output,
a mixer having a first input coupled to the output of the LNA, a second input coupled to the transmitter path, and an output, and
a first amplifier comprising:
an input coupled to the output of the mixer,
an output coupled to the ADC, and
a high-pass filter; and
a controller coupled to the transmitter path and to the receiver path, wherein the controller is configured to:
for each chirp of the plurality of chirps:
cause a corner frequency of the first high-pass filter to increase from a first value to a second value before transmission of the chirp,
simultaneously or after causing the corner frequency of the high-pass filter to increase, cause the transmitter path to be enabled before transmission of the chirp, and
after beginning transmission of the chirp in the enabled transmitter path, and during transmission of the chirp in the enabled transmitter path, cause the corner frequency of the high-pass filter to decrease from the second value to the first value.

20. The radar system of claim 19, wherein the controller is further configured to:
cause the transmitter path to be disabled after transmission of each chirp of the plurality of chirps.

21. The radar system of claim 19, wherein the radar system is a millimeter-wave radar system.

22. The radar system of claim 19, wherein the radar system is installed in an automotive vehicle.

23. A method comprising:
before transmitting a signal, increasing a corner frequency of a high-pass filter of an amplifier in a receiver path of a transceiver from a first value to a second value;
simultaneously or after increasing the corner frequency of the high-pass filter and before transmission of the signal, enabling a transmitter path of the transceiver;
transmitting the signal in the transmitter path after the transmitter path is enabled;
after the signal begins transmission in the transmitter path, and during transmission of the signal in the transmitter path, decreasing the corner frequency of the high-pass filter from the second value to the first value; and
disabling the transmitter path for a period of time after transmission of the signal.

24. The method of claim 23, wherein enabling the transmitter path comprises enabling a power amplifier of the transmitter path.

* * * * *